United States Patent [19]
Sakata et al.

[11] Patent Number: 6,042,372
[45] Date of Patent: Mar. 28, 2000

[54] HEAT TREATMENT APPARATUS

[75] Inventors: Kazunari Sakata, Sagamihara; Tamotsu Tanifuji, Yamato; Akihiko Tsukada, Isehara, all of Japan

[73] Assignee: Tokyo Electron Limited, Tokyo, Japan

[21] Appl. No.: 09/091,419

[22] PCT Filed: Oct. 20, 1997

[86] PCT No.: PCT/JP97/03772

§ 371 Date: Jun. 24, 1998

§ 102(e) Date: Jun. 24, 1998

[87] PCT Pub. No.: WO98/19334

PCT Pub. Date: May 7, 1998

[30] Foreign Application Priority Data

Oct. 31, 1996 [JP] Japan ................................ 8-305652

[51] Int. Cl.⁷ .............................................. B65G 49/07
[52] U.S. Cl. ..................... 432/241; 414/804; 414/938; 414/939; 414/940
[58] Field of Search ................................. 432/239, 241, 432/242; 414/804, 805, 809, 814, 938, 939, 940

[56] References Cited

U.S. PATENT DOCUMENTS

| | | | |
|---|---|---|---|
| 5,162,047 | 11/1992 | Wada et al. ........................... | 414/204 |
| 5,378,283 | 1/1995 | Ushikawa ............................. | 414/938 |
| 5,697,749 | 12/1997 | Iwabuchi et al. ..................... | 432/239 |
| 5,899,653 | 5/1999 | Brodine ................................ | 414/939 |

Primary Examiner—Denise L. Ferensic
Assistant Examiner—Gregory A. Wilson
Attorney, Agent, or Firm—Oblon, Spivak, McClelland, Maier & Neustadt, P.C.

[57] ABSTRACT

A vertical heat treatment apparatus for semiconductor wafers (W) including a heat treating furnace (19) which is heated to 600° C. or higher. In the heat treating furnace (19), the wafers (W) are subjected to batch treatment while they are placed on a boat (16). A preparatory vacuum chamber (102) is airtightly connected to a lower side of the heat treating furnace (19). Disposed in the preparatory vacuum chamber (102) are a horizontal transfer mechanism (201) and a vertical transfer mechanism (202) for transferring the boat (16). The two transfer mechanisms (201 and 202) are supported by support members (29a and 33a) mounted on a mechanical base (28). The preparatory vacuum chamber (102) and the support members (29a and 33a) are airtightly connected to each other by means of bellows.

20 Claims, 5 Drawing Sheets

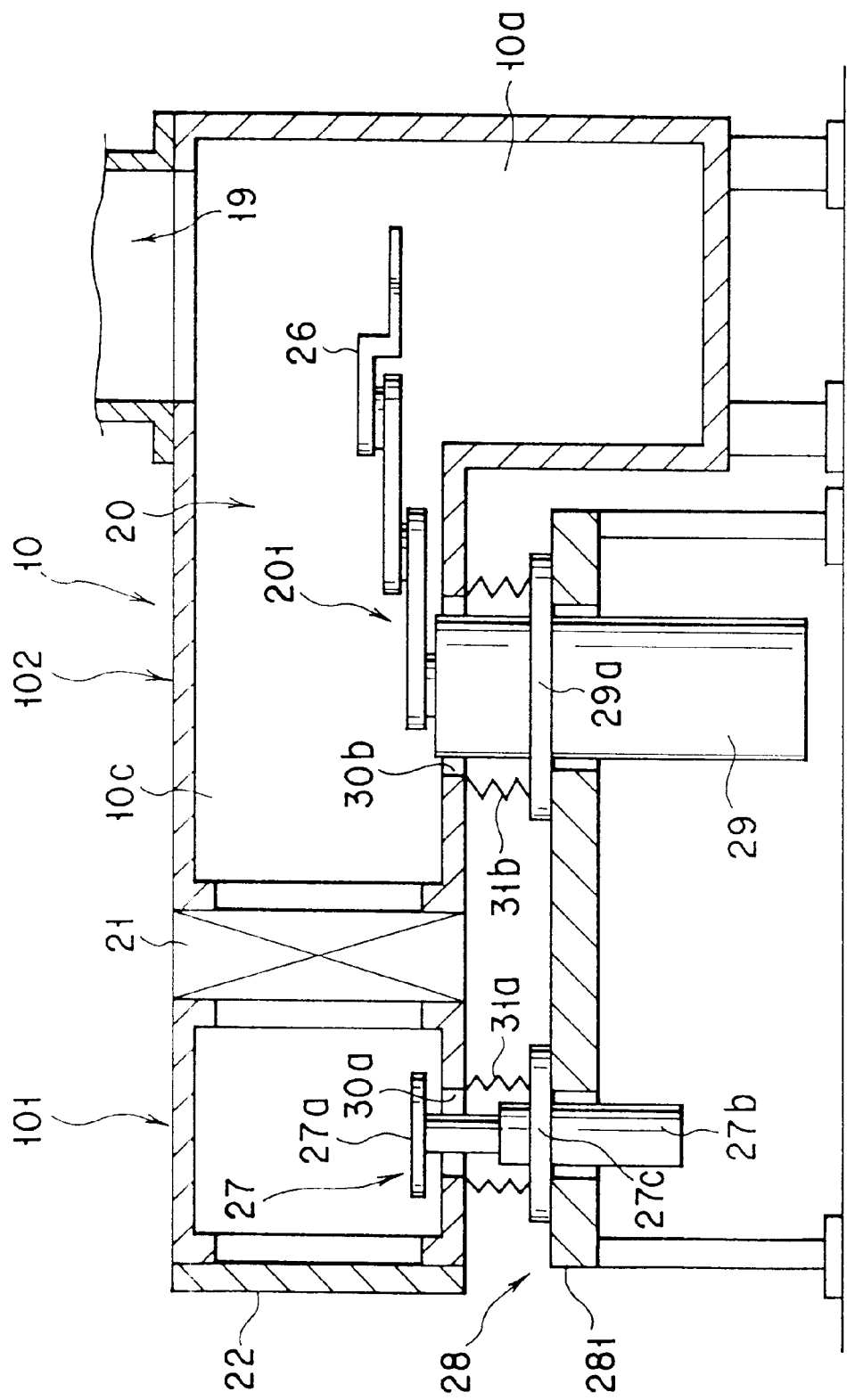
F I G. 1

HEAT TREATMENT APPARATUS

BACKGROUND OF THE INVENTION

1. Field of the Invention

The present invention relates to a heat treatment apparatus for heat treating a target substrate, such as a semiconductor wafer, and more particularly, to a hot-wall type vertical heat treatment apparatus.

2. Discussion of the Background

In the manufacture of semiconductor devices, various heat treatment apparatuses are used in order to apply various treatments, such as oxidation, diffusion, CVD, and so forth, to semiconductor wafers, i.e., the target substrates. As one of such heat treatment apparatuses, there is known, for instance, a single-substrate-processing type in which, a lord-lock chamber, i.e., a preparatory vacuum chamber connected to a treatment chamber, i.e., a heat treatment furnace, is disposed, and, in this preparatory vacuum chamber, a wafer transfer mechanism is provided. In the case of this heat treatment apparatus, by previously setting the interior of the lord-lock chamber at approximately the same pressure as that in the heat treatment furnace, a wafer can be transferred in and out of the heat treatment furnace by opening the furnace throat without resetting the pressure in the heat treatment furnace to the atmospheric pressure; and thus, the shortening of the required time and the improvement in throughput can be realized.

By the way, the transfer mechanism etc. are directly mounted in the preparatory vacuum chamber. In case that the heat treatment furnace is of the so-called cold wall type in which a wafer is directly heated by lamp heating or the like, the preparatory vacuum chamber is hard to be thermally affected from the heat treatment furnace. Accordingly, even if the transfer mechanism is directly mounted in the preparatory vacuum chamber, such an arrangement does not cause problem so much.

However, in case that, in the heat treatment apparatus, the heat treatment furnace is of the so-called hot-wall type in which the peripheral surface of the reaction tube is surrounded by a heater wire and a heat insulation layer to heat the whole interior of the furnace, the preparatory vacuum chamber is thermally affected by the radiant heat when the thermally treatment furnace is opened. Therefore, where the transfer mechanism is mounted directly in the preparatory vacuum chamber, the axial position of the transfer mechanism is deviated due to the strain or deformation of the preparatory vacuum chamber which has been thermally affected; and thus, there is the fear that the matching accuracy may become deteriorated. Further, in order to assure the matching accuracy of the transfer mechanism, it is necessary to machine the preparatory vacuum chamber with a high accuracy, which results in increasing the manufacturing costs, this being a problematic matter, too.

SUMMARY OF THE INVENTION

Thus, it is an object of the present invention to provide a heat treatment apparatus constructed such that the above-mentioned problems are overcome; even if the preparatory vacuum chamber is strained or deformed, there is no fear that the matching accuracy of the transfer mechanism may become deteriorated, and there is no need of machining the preparatory vacuum chamber with a high accuracy.

According to a first aspect of the present invention, there is provided a heat treatment apparatus for applying a heat treatment to a target substrate, comprising:

an airtight treating chamber for accommodating therein the target substrate;

a holding member for holding the target substrate in the treating chamber;

a supplying system for supplying a treating gas into the treating chamber;

heating means for heating an internal atmosphere of the treating chamber to 400° C. or higher;

a preparatory vacuum chamber airtightly connected to the treating chamber;

closing means for selectively shutting off the communication between the treating chamber and the preparatory vacuum chamber;

an exhausting system for exhausting the treating chamber and the preparatory vacuum chamber and, further, setting the treating chamber and the preparatory vacuum chamber to vacuum independently of each other;

a transfer mechanism for transferring the target substrate within the preparatory vacuum chamber;

a support member which supports the transfer mechanism so as to become substantially independent of thermal deformation of the preparatory vacuum chamber; and a flexible joint seal which airtightly connects the preparatory vacuum chamber and the support member.

According to a second aspect of the present invention, there is provided a vertical heat treatment apparatus for applying a heat treatment, in a batch, to a plurality of target substrates which belong to a group of substrates having substantially the same contour size, comprising:

an airtight treating chamber for accommodating the target substrates therein;

a holding member for holding the target substrates, in the treating chamber, in a stacked state with intervals therebetween;

a supplying system for supplying a treating gas into the treating chamber;

heating means for heating an internal atmosphere of the treating chamber to 600° C. or higher;

a preparatory vacuum chamber airtightly connected to the treating chamber;

closing means for selectively shutting off the communication between the treating chamber and the preparatory vacuum chamber;

an exhausting system for exhausting the treating chamber and the preparatory vacuum chamber and, further, setting the treating chamber and the preparatory vacuum chamber to vacuum independently of each other;

a vertical transfer mechanism for transferring the holding member in a vertical direction between a loading position within the treating chamber and a stand-by position directly under the treating chamber and within the preparatory vacuum chamber;

a horizontal transfer mechanism for transferring the holding member in the horizontally direction between the stand-by position and a position outside the preparatory vacuum chamber;

a first support member which supports the horizontally transfer mechanism so as to become substantially independent of thermal deformation of the preparatory vacuum chamber; and a flexible joint seal which airtightly connects the preparatory vacuum chamber and the first support member to each other.

According to a third aspect of the present invention, there is provided a vertical heat treatment apparatus for applying a heat treatment, in a batch, to a plurality of target substrates which belong to a group of substrates having substantially the same contour size, comprising:

an airtight treating chamber for accommodating the target substrates therein;

a holding member for holding the target substrates, in the treating chamber, in a stacked state with intervals therebetween;

a supplying system for supplying a treating gas into the treating chamber;

heating means for heating an internal atmosphere of the treating chamber to 600° C. or higher;

a preparatory vacuum chamber airtightly connected to the treating chamber;

closing means for selectively shutting off the communication between the treating chamber and the preparatory vacuum chamber;

an exhausting system for exhausting the treating chamber and the preparatory vacuum chamber and, further, setting the treating chamber and the preparatory vacuum chamber to vacuum independently of each other;

a vertical transfer mechanism for transferring the holding member in a vertical direction between a loading position within the treating chamber and a stand-by position directly under the treating chamber and within the preparatory vacuum chamber;

a horizontal transfer mechanism for transferring the holding member in a horizontal direction between the stand-by position and a position outside the preparatory vacuum chamber;

a support member which supports the vertically transfer mechanism so as to become substantially independent of thermal deformation of the preparatory vacuum chamber; and a flexible joint seal which airtightly connects the preparatory vacuum chamber and the support member to each other.

If the internal atmosphere of a treating chamber is heated to 400° C. or higher, more particularly, a 600° C. or higher, then the radiation becomes dominant in the transfer of heat. In this case, a preparatory vacuum chamber directly connected to the treating chamber is apt to be thermally affected and deformed when the treating chamber is opened. If a transfer mechanism in the preparatory vacuum chamber is positionally deviated due to this thermal deformation, then it becomes impossible to accurately transfer a holding member which holds a target object. Accordingly, it is effective that the transfer mechanism is supported by a support member connected to the preparatory vacuum chamber through a flexible joint seal to make the transfer mechanism independent of thermal deformation of the preparatory vacuum chamber.

BRIEF DESCRIPTION OF THE DRAWINGS

A more complete appreciation of the invention and many of the attendant advantages thereof will be readily obtained as the same becomes better understood by the reference to the following detailed description when considered in connection with the accompanying drawings, wherein:

FIG. 1 is a vertically sectioned side view schematically showing the preparatory vacuum chamber in a heat treatment apparatus shown in FIG. 2;

DESCRIPTION OF THE PREFERRED EMBODIMENTS

Figure 2:
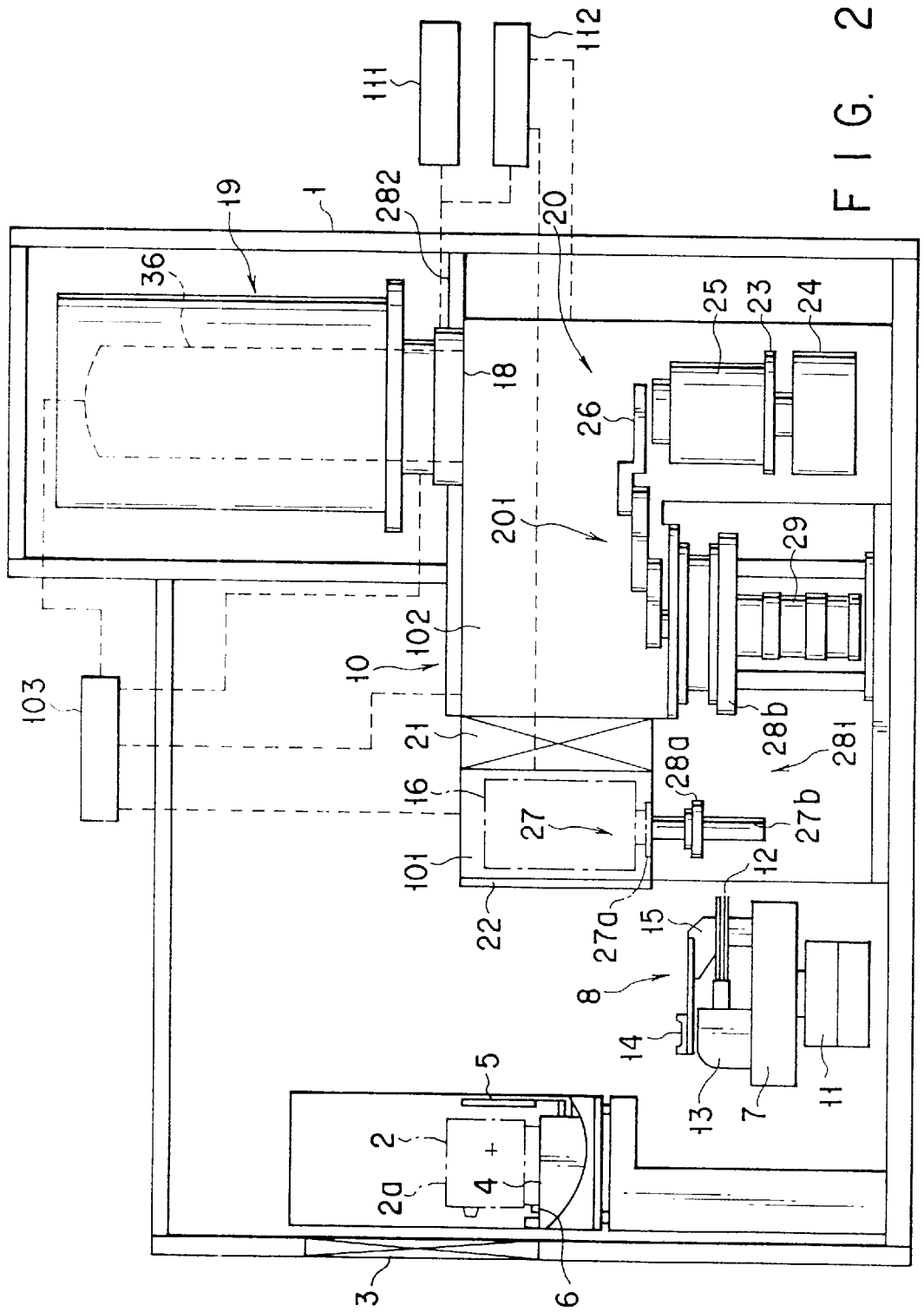
FIG. 2 is a side view showing the arrangement of the heat treatment apparatus according to an embodiment of the present invention.

Referring now to the drawings, wherein like reference numerals designate identical or corresponding parts throughout the several views, and more particularly to FIGS. 1 to 6 thereof, there are illustratedd embodiments of the present invention as will be further discussed.

Figure 3:
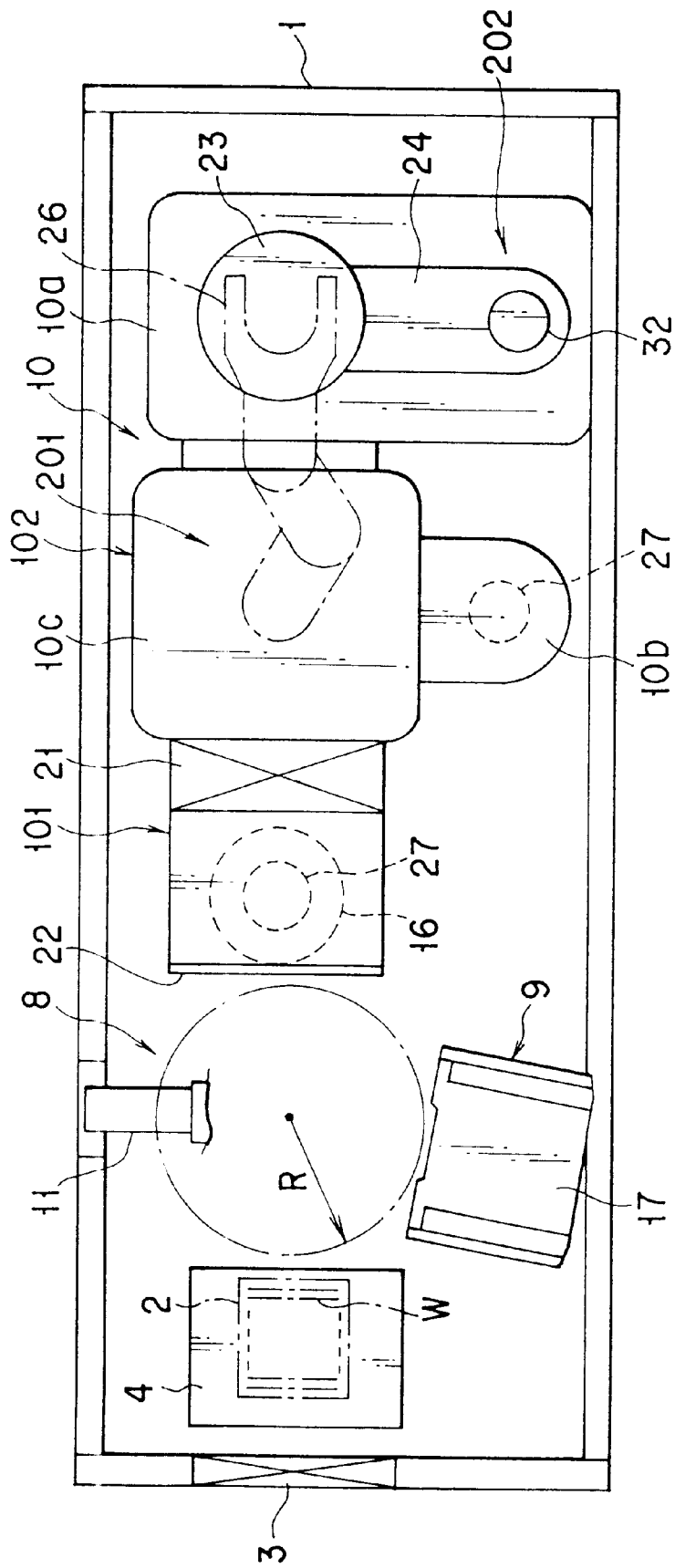
FIG. 3 is a plan view showing the arrangement of the heat treatment apparatus shown in FIG. 2.

In FIGS. 2 to 3, the reference numeral 1 denotes a housing of a hot wall and batch processing type vertical heat treatment apparatus shown, by way of example, as the heat treatment apparatus. Numeral 2 denotes a cassette, i.e., a transferring container in which a plurality of, e.g., about 25, semiconductor wafers W, i.e., target substrates, are accommodated in a state held vertically upright and at a predetermined pitch. The cassette 2 has an accommodating opening 2a in the upper portion thereof. At one end of the housing 1, an inlet/outlet port 3 with an opening/closing gate for transferring the cassette 2 in and out. In the housing 1, near the inlet/outlet port 3, there is disposed a table 4 on which the cassette 2 is placed in a vertically upright state with the accommodating opening 2a positioned at the top.

Disposed on the table 4 are holding portions 5 and 6 for holding the cassette 2 from the front and back sides, an orientation flat aligner (not shown) for performing the orientation flat alignment of the wafers W in the cassette 2, etc. Further, the table 4 is disposed so as to be vertically turnable and thus can turn by about 90° the cassette 2 in order to bring the wafers W in the cassette 2 from the vertical state to a horizontal state. In the housing 1, there is disposed a transfer mechanism 8 having a base 7 which is movable up and down and rotatable. Disposed around the base 7 are the table 4, a storing rack 9 on which the cassette 2 is disposed, and a first preparatory vacuum chamber (also known as load-lock chamber) 101 to be described later.

The transfer mechanism 8 has an up-and-down arm 11 which is disposed so as to be movable up and down by an elevating mechanism using a ball screw etc. On the up-and-down arm 11, the base 7 is mounted so as to be horizontally rotatable. In the up-and-down arm 11, there is disposed a rotation-driving unit (not shown) for rotating the base 7 so as to be able to position the base stand.

On the base 7, there is disposed a wafer handler 13 which has a plurality of, e.g., 5, strip-like wafer supporting portions (also known as a fork) extending out horizontally for supporting the wafers W. Also disposed on the base 7 is a cassette handler 15 having a cassette support portion 14 horizontally extending out for supporting the cassette 2 in a state placed thereon. The wafer handler 13 and the cassette handler 15 are opposed to each other and reciprocatingly movable. By the cassette handler 15, the cassette 2 is moved between the table 4 and the storing rack 9. By the wafer handler 13, the wafers W are moved between the interior of the cassette 2 on the storing rack 9 and a boat 16, which will be described later, in the first preparatory vacuum chamber 101.

The cassette support portion 14 is disposed so as to lie directly above the wafer handler 13 in a state where the wafer handler 13 and the cassette handler 15 are at their stand-by positions on the base 7. With this arrangement, the cassette 2 can be rotated in a state where it does not protrude out from the base 7, and thus, the radius R of turning can be reduced. The storing rack 9 has a plurality of, e.g., 4, shelf portions 17 so as to allow a plurality of cassettes 2 to be set in the height direction.

In the upper part at the rear end side of the housing 1, there is disposed an airtight treatment chamber, i.e., a vertical heat treatment furnace 19 with a furnace throat 18 in the lower portion thereof. Continuing to the heat treatment furnace 19, a preparatory vacuum section 10 is airtightly disposed, which (load-lock unit) is brought into approximately the same degree of vacuum as the degree of vacuum, e.g., 1 Torr, during the heat treatment thereof. In the preparatory vacuum section 10, a transfer mechanism 20 to be described later is disposed. The preparatory vacuum section 10 comprises a first load-lock chamber, i.e., preparatory vacuum chamber 101 at the side of the inlet/outlet port 3 and a second load-lock chamber, i.e., preparatory vacuum chamber 102 at the side of the heat treatment furnace 19. Interposed between the first and second preparatory vacuum chambers 101 and 102 is a gate valve 21 for opening and closing the passage therebetween.

The heat treatment furnace 19 and the first and second preparatory vacuum chambers 101 and 102 are connected to a common exhausting mechanism 103. The exhausting mechanism 103 can exhaust the heat treatment furnace 19 and the first and second preparatory vacuum chambers 101 and 102 independently of one another and set the degrees of vacuum thereof to optional values individually. Connected to the heat treatment furnace 19 are a treating gas supplying mechanism 111 for supplying a treating gas, e.g., water vapor in the case of an oxidation treatment, and a replacement gas supplying mechanism 112 for supplying a replacement gas, e.g., nitrogen, argon or another inert gas. The replacement gas supplying mechanism 112 is also connected to the first and second preparatory vacuum chambers 101 and 102.

The first preparatory vacuum chamber 101 is used for accommodating the quartz-made boat 16, i.e., a substrate holding member, transferring the wafers W and performing pre-evacuation. The boat 16 is used for inserting a plurality of, e.g., thirty, wafers W into the heat treatment furnace 19. The first preparatory vacuum chamber 101 is disposed at a position opposed to the table 4 with the base 7 located therebetween.

The front surface portion of the first preparatory vacuum chamber 101 which faces the base 7 has an opening, and, in this front surface portion, there is disposed a load-lock door 22 for opening or closing this opening.

The first preparatory vacuum chamber 101 is controlled to the same pressure as that in the second preparatory vacuum chamber 102 when the gate valve 21 is opened to allow the first preparatory vacuum chamber 101 to communicate with the second preparatory vacuum chamber 102. Further, the first preparatory vacuum chamber 101 is controlled to the same pressure (atmospheric pressure) as that in the housing 1 when the load-lock door 22 is opened to allow the first preparatory vacuum chamber 101 to communicate with the interior of the housing 1 in a state where the gate valve 21 is closed.

The second preparatory vacuum chamber 102 has three areas, i.e., a loading area 10a, a buffer area 10b and a transfer area 10c, which communicate with one another. The loading area 10a is used for transferring the boat 16 into and out from the furnace, beneath the heat treatment furnace 19. The buffer area 10b is used, in case two boats 16 are used, for temporarily placing the boat 16 transferred out from the heat treatment furnace 19 so that the boats 16 do not interfere with each other. In the transfer area 10c, a horizontal transfer mechanism 201 (to be described later) for transferring the boat 16 in the horizontal direction.

In the loading area 10a, a lid 23 for covering or uncovering the throat 18 of the heat treatment furnace 19 is disposed so as to be movable up and down by an up-and-down arm 24 of a vertical transfer mechanism (elevating mechanism) 202. On the lid 23, the boat 16 is placed through a quartz-made heat insulation cylinder 25. The boat 16 is transferred in the vertical direction by the vertical transfer mechanism 20, so that the boat 16 is transferred into the heat treatment furnace 19 and transferred out of the heat treatment furnace 19.

Disposed in the transfer area 10c is the horizontal transfer mechanism 201 having a transfer arm 26 of a multiarticulated arm structure for transferring the boat 16 onto the heat insulation cylinder 25 from the first preparatory vacuum chamber 101 or transferring the boat 16 from on the heat insulation cylinder 25 into the first preparatory vacuum chamber 101 through the buffer area 10b. Further, the heat insulation cylinder 25 is formed so as to be able to be transferred out from on the lid 23 into the first preparatory vacuum chamber 101 by the horizontal transfer mechanism 201 and transferred out from the housing 1 for the purpose of washing or the like.

The horizontal transfer mechanism 201 does not have the function of moving the boat 16 up and down. Due to this, in the first preparatory vacuum chamber 101 and the buffer area 10b, there is provided a substrate holding member placement stand (also known as a boat stand) 27 for placing the boat 16 thereon so as to be movable up and down in order to allow the exchange of the boat 16 between the boat stand 27 and the transfer arm 26. In this connection, the horizontal transfer mechanism 201 can have the function of moving the boat 16 up and down through the transfer arm 26. In this case, the boat stand 27 need not be constructed so as to be movable up and down.

The transfer mechanism 20 is supported on a mechanical base 28 independent of the preparatory vacuum section 10 so as to be independent of the thermal deformation of the preparatory vacuum section 10. The mechanical base 28 includes a first base portion 281 disposed beneath the preparatory vacuum section 10 and a second base portion 282 disposed above the preparatory vacuum section 10. Further, the transfer mechanism 20 includes the horizontal transfer mechanism 201 supported by the first base portion 281 and the horizontal transfer mechanism 202 supported by the second base portion 282. The first base portion 281 is disposed beneath the first preparatory vacuum chamber 101 and the second preparatory vacuum chamber 102 (excepting the loading area 10a) in an independent state separated from them. On the first base portion 281, the horizontal transfer mechanism 201 and the boat stand 27 are set independently of the first and second preparatory vacuum chambers 101 and 102. The first base portion 281 is formed of, for instance, an aluminum alloy.

The horizontal transfer mechanism 201 includes the transfer arm 26, i.e., an operating portion, and a driver 29 for driving the transfer arm 26, wherein the driver 29 is mounted to the first base portion 281 through a flange 29a. Further, the boat stand 27 includes a table portion 27a on which the boat 16 is placed, and a driver 27b, e.g., an air cylinder for driving the table portion 27a so as to move up and down. The driver 27b is mounted to the first base portion 281 through a flange 27c. In the bottom portions of the first and second preparatory vacuum chambers 101 and 102, openings 30a and 30b for allowing the boat stand 27 and the horizontal transfer mechanism 201 to extend into the respective preparatory vacuum chambers 101 and 102. Between the edges of the respective openings 30a and 30b and the flanges 29a and 27c, flexible joint seals for hermetic vacuum sealing and, more specifically, tubular expandable and contractible bellows 31a and 31b which have the axes of expansion and contraction in the vertical direction are airtightly mounted.

Further, one-side ends of the bellows 31a and 31b may be directly and airtightly connected to the respective drivers 29 and 27b of the horizontal transfer mechanism 201 and the boat stand 27, instead. The first base portion 281 may be divided, as shown in FIG. 2, into a portion 28a in which the horizontal transfer mechanism 201 is set and a portion 28b in which the boat stand 27 is set.

Figure 4:
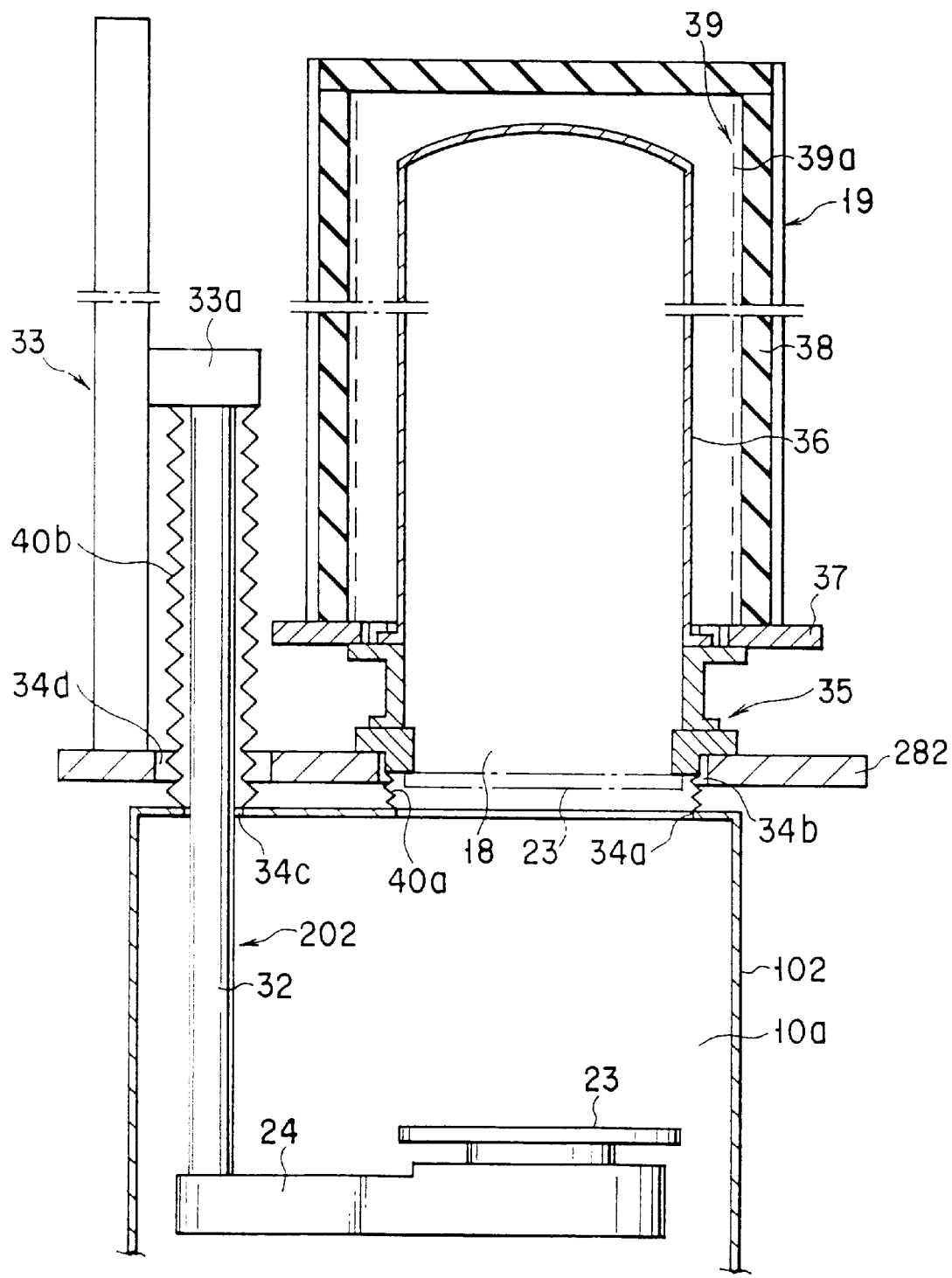
FIG. 4 is a vertically sectioned side view showing the heat treatment furnace and the preparatory vacuum chamber in the heat treatment apparatus shown in FIG. 2.

On the other hand, the second base portion 282 is set above the second preparatory vacuum chamber 102 in a state independently separated from the second preparatory vacuum chamber 102 as shown in FIG. 4. The vertical transfer mechanism 202 and the heat treatment furnace 19 are supported by the second base portion 282 so as to be independent of the thermal deformation of the preparatory vacuum section 10. The second base portion 282 is formed into the shape of a plate by the use of stainless steel and mounted to the housing 1 such that it is laid down. The vertical transfer mechanism 202 includes the up-and-down arm 24 and an up-and-down vertical rod 32 connected to the up-and-down arm 24. The up-and-down rod 32 is connected to a movable frame 33a of a driver 33 mounted on the second base portion 282.

In the top portion of the second preparatory vacuum chamber 102 and the second base portion 282, there are formed openings 34a and 34b corresponding to the furnace throat 18 and the openings 34c and 34d through which the up-and-down rod 32 of the vertical transfer mechanism 202 extends. The heat treatment furnace 19 has an annular manifold 35 made of, for instance, stainless steel and set on the upper end of the opening 34b formed, for the furnace throat, in the second base portion 282. To the upper end of the manifold 35, a reaction tube 36 made of for instance quartz is mounted. Further, on the upper end of the manifold 35, a heater base 37 is also mounted. On the heater base 37, a heater 39 is mounted such that a heater wire 39a is disposed on the inner peripheral surface of a cylindrical heat insulating member 38 covering the reaction tube 36. In this way, the hot wall type heat treatment furnace 19 whose internal atmosphere is heated to 400° C. or higher and, ordinarily, heated to 600° C. or higher is constituted.

The manifold 35 defines the throat 18 of the heat treatment furnace 19, and the open end thereof is closed up from below by the lid 23. Further, between the edge of the opening 34a formed, for the furnace throat, in the second preparatory vacuum chamber 102 and the manifold 35, a flexible joint seal for airtight vacuum sealing and, more specifically, bellows 40a which have an axis of expansion and contraction in the vertical direction are airtightly mounted. Also, between the edge of the opening 34c for the up-and-down rod and the movable frame 33a connected to the upper end of the up-and-down rod 32, a flexible joint seal for airtight vacuum sealing and, more specifically, bellows 40b which have an axis of expansion and contraction in the vertical direction are airtightly mounted. Further, to the manifold 35, there are connected various pipes which communicate with the exhausting mechanism 103, the treating gas supplying mechanism 111 and the replacement gas supplying mechanism 112 in order to introduce the treating gas and pressure-reducing and exhausting the interior of the furnace. As the heat treatment furnace 19, the type which has an evacuation pipe in the upper portion of the reaction pipe 36 may alternatively be used. The manifold 35 should desirably be constructed so as to be splittable into upper and lower portions in view of the maintenance thereof.

If the internal atmosphere of the heat treatment furnace 19 is heated to 400° C. and, more particularly, to 600° C. or higher, then the radiation becomes dominant in the transmission of heat. In this case, the preparatory vacuum section 10 and, more particularly, the preparatory vacuum chamber 102 is apt to be heat-affected and heat-deformed when the heat treatment furnace 19 is opened. If the horizontal and vertical transfer mechanisms 201 and 202 are positionally deviated by the influence of the heat deformation, then it becomes impossible to accurately transfer the boat 16. Thus, it is effective that, as according to this embodiment, the horizontal and vertical transfer mechanisms 201 and 202 are supported by the mechanical base 28 (281 and 282) independent of the preparatory vacuum section 10 so as to become independent of the heat deformation of the preparatory vacuum section 10.

Next, the working of the above-mentioned embodiment will be described.

When the cassette 2 in which the wafers W are accommodated in a vertically upright state is transferred into the housing 1 of the heat treatment apparatus through the inlet/outlet port 3 and placed on the table 4, the cassette 2 is held by holding portions 5 and 6 from the front and rear sides. After the orientation flat alignment thereof, the cassette 2 is turned by approximately 90° C. together with the table 4 so as to bring the wafers W into a horizontal state. As a result, the cassette 2 is brought from the vertical state, where the accommodating opening 2a is positioned at the top, into the horizontal state, where the accommodating opening 2a is directed horizontally.

By the upward and downward movement of the up-and-down arm 11, the turning of the base 7 and the movement of the cassette handler 15 in the transfer mechanism 8, the cassette 2 is transferred from the table 4 onto the shelf portion 17 of the storing rack 9. If a predetermined number of cassettes 2 are thus transferred onto the respective shelf portions 17 of the storing rack 9, then, by the upward and downward movement of the up-and-down arm 11, the turning of the base 7, and the movement of the wafer handler 13 in the transfer mechanism 8, the wafers W are transferred from within the respective cassettes 2 on the storing rack 9 onto the boat 16 to be treated, which has been disposed on the boat stand 27 in the first preparatory vacuum chamber 101.

When the wafers W are transferred, the gate valve 21 between the first preparatory vacuum chamber 101 and the second preparatory vacuum chamber 102 is closed, and the load-lock door 22 of the first preparatory vacuum chamber 101 is opened. When a predetermined number of wafers W have been transferred onto the boat 16, the load-lock door 22 is closed, and the interior of the first preparatory vacuum chamber 101 is exhausted to a predetermined degree of vacuum.

On the other hand, when the heat treatment performed in the heat treatment furnace 19 at the same time is finished, the lid 23 is lowered by the up-and-down arm 24 of the vertical transfer mechanism 202, whereby the throat 18 of the heat treatment furnace 19 is opened. Further, the boat 16 already treated and the heat insulation cylinder 25 are lowered from within the heat treatment furnace 19 down into the loading area 10a of the second preparatory vacuum chamber 102. Next, by the transfer arm 26 of the horizontal transfer mechanism 201, the boat 16 already treated is transferred from on the heat insulation cylinder 25 onto the boat stand 27 in the buffer area 10b and temporarily placed there. Next, the gate valve 21 between the first preparatory vacuum chamber 101 and the second preparatory vacuum chamber 102 is opened, and the to-be-treated boat 16 in the first preparatory vacuum chamber 101 is transferred, by the transfer arm 26, onto the heat insulation cylinder 25 of the up-and-down arm 24 in the loading area 10a. Further, the boat 16 already treated which is in the buffer area 10b is transferred into the first preparatory vacuum chamber 101.

After the transfer of the two boats 16, the gate valve 21 is closed. Next, the lid 23 is moved upwards by the up-and-down arm 24 of the vertical transfer mechanism 202, whereby the to-be-treated boat 16 and the heat insulation cylinder 25 are inserted into the heat treatment furnace 19. Further, the furnace throat 18 is closed up by the lid 23, and a predetermined heat treatment is started. On the other hand, the wafers already treated are transferred, from the treated boat 16 transferred into the first preparatory vacuum chamber 101, into an empty cassette 2 on the storing rack 9. This cassette 2 is transferred from the storing rack 9 to the table 4 and then transferred out through the inlet/outlet port 3.

In the above-mentioned heat treatment apparatus, the transfer mechanism 20 is provided in the preparatory vacuum section 10 disposed to be connected to the heat treatment furnace 19. However, the transfer mechanism 20 is supported, by the mechanical base 28 independent of the preparatory vacuum section 10, so as to become independent of the heat deformation of the preparatory vacuum section 10. Due to this, even if the preparatory vacuum unit 10 is strained or deformed by the heat affection from the heat treatment furnace 19, there is no fear that the matching accuracy of the transfer mechanism 20 may become deteriorated. Further, since the matching accuracy of the transfer mechanism 20 is thus maintained, there is no need of machining the preparatory vacuum section 10 with a high accuracy.

More specifically, the transfer mechanism 20 is constituted such that, in the preparatory vacuum section 10, the openings 30a, 30b and 34c for the transfer mechanism 20 are disposed, and, between the edges of the openings 30a, 30b and 34c and the support members of the transfer mechanism 20 supported by the mechanical base 28, flexible joint seals for airtight vacuum sealing and, more specifically, the bellows 31a, 31b and 40b are disposed. Due to this, even if the preparatory vacuum section 10 is strained or deformed by the heat affection from the heat treatment furnace 19, the relative displacement between the preparatory vacuum section 10 and the mechanical base 28 or the transfer mechanism 20 can be absorbed by the bellows 31a, 31b and 40b, while vacuum-sealing the openings 30a, 30b and 34c by the bellows 31a, 31b and 40b. Further, by the bellows 40a, the relative displacement between the heat treatment furnace 19 and the preparatory vacuum section 10 can be absorbed, while airtightly coupling the throat 18 of the heat treatment furnace 19 and the edge of the opening 34a of the preparatory vacuum section 10.

The mechanical base 28 includes the first base portion 281 disposed beneath the preparatory vacuum section 10. On the first base portion 281, the horizontal transfer mechanism 201 for transferring the boat 16 in the horizontal direction and the boat stand 27 for placing the boat thereon 16 are supported. Due to this, even if the preparatory vacuum section 10 is strained or deformed by the heat affection from the heat treatment furnace 19, there is no fear that the matching accuracy of the horizontal transfer mechanism 201 with reference to the boat stand 27 may become deteriorated.

The mechanical base 28 further includes the second base portion 282 disposed above the preparatory vacuum section 10. By the second base portion 282, the vertical heat treatment furnace 19 having the throat 18 in the lower portion thereof and the vertical transfer mechanism 202 for transferring the boat 16 into and out from the heat treatment furnace 19 are supported. Due to this, even if the preparatory vacuum section 10 is strained or deformed by the heat affection from the heat treatment furnace 19, there is no fear that the matching accuracy of the vertical transfer mechanism 202 with reference to the heat treatment furnace 19 may become deteriorated. Thus, there is no fear that the matching accuracy of the manifold 35 defining the furnace throat 18 and the lid 23 covering the furnace throat 18 may become deteriorated. That is, by the upward and downward movement of the lid 23, the boat 16 and the thermal insulating tube 25 can be surely transferred into the heat treatment furnace 19 or transferred out from within the heat treatment furnace 19, and further the furnace throat 18 can be surely closed up by the lid 23.

Figure 5:
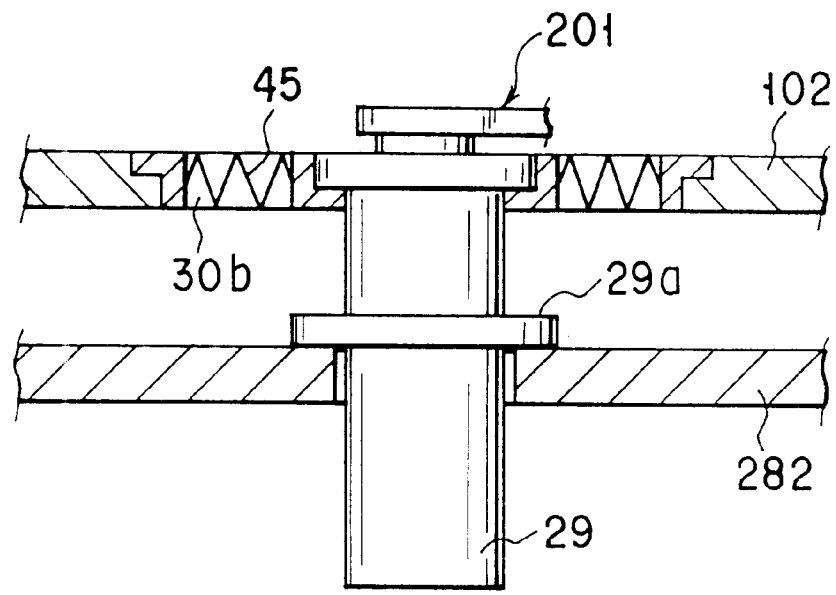
FIG. 5 is a vertically sectioned side view showing modification of a flexible joint seal used in the heat treatment apparatus shown in FIG. 2.
Figure 6:
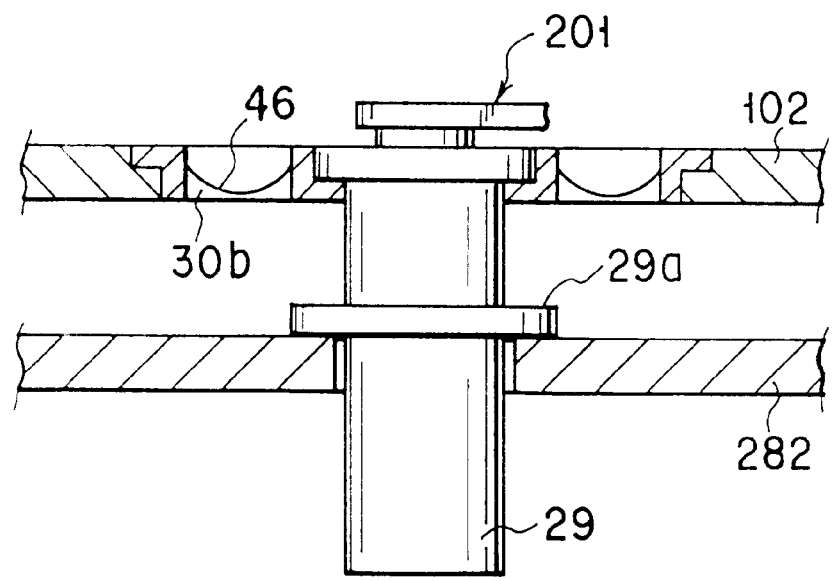
FIG. 6 is a longitudinally section side view showing another modification of the flexible joint seal used in the heat treatment apparatus shown in FIG. 2.

FIGS. 5 and 6 are vertically sectioned side views, respectively, showing modifications of the flexible joint seals used in the heat treatment apparatus shown in FIG. 2.

In the modification shown in FIG. 5, the gap between the edge of the opening 30b in the second preparatory vacuum chamber 102 and the driver 29 which functions as the support member of the horizontal transfer mechanism 201 is sealed by airtight-vacuum-sealing bellows 45 which have an axis of expansion and contraction in the horizontal direction. Further, in order for the load of the horizontal transfer mechanism 201 to be supported by the first base portion 282, the driver 29 is fixed to the first base portion 282 beneath the bellows 45.

In the case of the modification shown in FIG. 6, the gap between the edge of the opening 30b in the second preparatory vacuum chamber 102 and the driver 29 which functions as the support member of the horizontal transfer mechanism 201 is sealed by a horizontally disposed diaphragm 46. Further, in order for the load of the horizontal transfer mechanism 201 to be supported by the first base portion 282, the driver 29 is fixed to the first base portion 282 beneath the diaphragm 46.

The modifications shown in FIGS. 5 and 6 are related to the horizontal transfer mechanism 201, but, the bellows 31a, 40a and 40b in other portions can also be similarly modified. However, in the case of the opening 30a or 34a through which the driving shaft extends so as to be movable up and down, it is necessary to dispose a seal structure, such as a magnetic fluid seal or the like in the center of the flexible joint seal in order to seal that portion of the driving shaft which extends through the opening.

In the above, the embodiment of the present invention has been described by reference to the drawings. However, the present invention is not limited to the above-mentioned embodiment, but can be variously altered in design without departure from the gist of the present invention. For instance, the present invention can also be applied to a single substrate heat treatment apparatus.

What is claimed as new and desired to be secured by Letters Patent of the United States is:

1. A heat treatment apparatus for applying a heat treatment to a target substrate, comprising:
   an airtight treating chamber for accommodating therein said target substrate;
   a holding member for holding said target substrate in said treating chamber;
   a supplying system for supplying a treating gas into said treating chamber;
   heating means for heating an internal atmosphere of said treating chamber to 400° C. or higher;
   a preparatory vacuum chamber airtightly connected to said treating chamber;
   closing means for selectively shutting off the communication between said treating chamber and said preparatory vacuum chamber;
   an exhausting system for exhausting said treating chamber and said preparatory vacuum chamber and, further, setting said treating chamber and said preparatory vacuum chamber to vacuum independently of each other;
   a transfer mechanism for transferring said target substrate within said preparatory vacuum chamber;
   a support member which supports said transfer mechanism substantially independent from said preparatory vacuum chamber, whereby said transfer mechanism is unaffected by thermal deformations of said preparatory vacuum chamber; and
   a flexible joint seal which airtightly connects said preparatory vacuum chamber and said support member.

2. The apparatus according to claim 1, wherein said heating means heats an internal atmosphere of said treating chamber to 600° C. or higher.

3. The apparatus according to claim 1, wherein said transfer mechanism transfers said target substrate together with said holding member in a state where said holding member holds said target substrate.

4. The apparatus according to claim 3, wherein said holding member holds a plurality of substrates having substantially a same contour size as said target substrate, in a stacked state with intervals therebetween.

5. The apparatus according to claim 1, further comprising a mechanical base which supports said treating chamber substantially independent from said preparatory vacuum chamber, whereby said treating chamber is unaffected by thermal deformations of said preparatory vacuum chamber.

6. The apparatus according to claim 5, further comprising a flexible joint seal which airtightly connects said treating chamber and said preparatory vacuum chamber to each other.

7. The apparatus according to claim 1, further comprising a mechanical base which supports said support member in a fixed state.

8. The apparatus according to claim 1, further comprising a mechanical base which supports said support member in a movable state.

9. The apparatus according to claim 1, wherein said flexible joint seal is a bellows.

10. The apparatus according to claim 1, wherein said flexible joint seal is a diaphragm.

11. A vertical heat treatment apparatus for applying a heat treatment, in a batch, to a plurality of target substrates which belong to a group of substrates having substantially a same contour size, comprising:
    an airtight treating chamber for accommodating said target substrates therein;
    a holding member for holding said target substrates, in said treating chamber, in a stacked state with intervals therebetween;
    a supplying system for supplying a treating gas into said treating chamber;
    heating means for heating an internal atmosphere of said treating chamber to 600° C. or higher;
    a preparatory vacuum chamber airtightly connected to said treating chamber;
    closing means for selectively shutting off the communication between said treating chamber and said preparatory vacuum chamber;
    an exhausting system for exhausting said treating chamber and said preparatory vacuum chamber and, further, setting said treating chamber and said preparatory vacuum chamber to vacuum independently of each other;
    a vertical transfer mechanism for transferring said holding member in a vertical direction between a loading position within said treating chamber and a stand-by position directly under said treating chamber and within said preparatory vacuum chamber;
    a horizontal transfer mechanism for transferring said holding member in the horizontal direction between said stand-by position and a position outside said preparatory vacuum chamber;
    a first support member which supports said horizontal transfer mechanism substantially independent from said preparatory vacuum chamber, whereby said horizontal transfer mechanism is unaffected by thermal deformations of said preparatory vacuum chamber; and
    a flexible joint seal which airtightly connects said preparatory vacuum chamber and said first support member to each other.

12. The apparatus according to claim 11, further comprising a mechanical base which supports said first support member in a fixed state.

13. The apparatus according to claim 11, further comprising:
    a mechanical base which supports said treating chamber substantially independent from said preparatory vacuum chamber, whereby said treating chamber is unaffected by thermal deformations of said preparatory vacuum chamber; and
    a flexible joint seal which airtightly connects said treating chamber and said preparatory vacuum chamber to each other.

14. The apparatus according to claim 13, further comprising:
    a second support member which supports said vertical transfer mechanism substantially independent from said preparatory vacuum chamber, whereby said vertical transfer mechanism is unaffected by thermal deformations of said preparatory vacuum chamber; and
    a flexible joint seal which airtightly connects said preparatory vacuum chamber and said second support member to each other.

15. The apparatus according to claim 14, further comprising:

an auxiliary preparatory vacuum chamber connected to said preparatory vacuum chamber through a gate;

a placement table for placing said holding member thereon, disposed in said auxiliary preparatory vacuum chamber;

a third support member which supports said placement table substantially independent from said auxiliary preparatory vacuum chamber, whereby said placement table is unaffected by thermal deformations of said auxiliary preparatory vacuum chamber; and a flexible joint seal which airtightly connects said auxiliary preparatory vacuum chamber and said third support member to each other.

16. The apparatus according to claim 15, wherein said placement table is movable up and down.

17. The apparatus according to claim 11, wherein said closing means has a lid which is moved up and down by said vertical transfer mechanism.

18. A vertical heat treatment apparatus for applying a heat treatment, in a batch, to a plurality of target substrates which belong to a group of substrates having substantially a same contour size, comprising:

an airtight treating chamber for accommodating said target substrates therein; a holding member for holding said target substrates, in said treating chamber, in a stacked state with intervals therebetween;

a supplying system for supplying a treating gas into said treating chamber; heating means for heating an internal atmosphere of said treating chamber to 600° C. or higher;

a preparatory vacuum chamber airtightly connected to said treating chamber; closing means for selectively shutting off the communication between said treating chamber and said preparatory vacuum chamber;

an exhausting system for exhausting said treating chamber and said preparatory vacuum chamber and, further, setting said treating chamber and said preparatory vacuum chamber to vacuum independently of each other;

a vertical transfer mechanism for transferring said holding member in a vertical direction between a loading position within said treating chamber and a stand-by position directly under said treating chamber and within said preparatory vacuum chamber;

a horizontal transfer mechanism for transferring said holding member in a horizontal direction between said stand-by position and a position outside said preparatory vacuum chamber;

a first support member which supports said vertical transfer mechanism substantially independent from said preparatory vacuum chamber, whereby said vertical transfer mechanism is unaffected by thermal deformations of said preparatory vacuum chamber; and a flexible joint seal which airtightly connects said preparatory vacuum chamber and said support member to each other.

19. The apparatus according to claim 18, further comprising a mechanical base which supports said support member in a movable state.

20. The apparatus according to claim 18, further comprising:

a mechanical base which supports said treating chamber substantially independent from said preparatory vacuum chamber, whereby said treating chamber is unaffected by thermal deformations of said preparatory vacuum chamber, and a flexible joint seal which airtightly connects said treating chamber and said preparatory vacuum chamber to each other.

* * * * *